US012593698B2

(12) United States Patent
Lai et al.

(10) Patent No.: US 12,593,698 B2
(45) Date of Patent: Mar. 31, 2026

(54) ELECTRONIC PACKAGE AND MANUFACTURING METHOD THEREOF

(71) Applicant: SILICONWARE PRECISION INDUSTRIES CO., LTD., Taichung City (TW)

(72) Inventors: Chia-Chu Lai, Taichung City (TW); Yi-Min Fu, Taichung City (TW); Chien-Sheng Chen, Taichung City (TW)

(73) Assignee: SILICONWARE PRECISION INDUSTRIES CO., LTD., Taichung City (TW)

( * ) Notice: Subject to any disclaimer, the term of this patent is extended or adjusted under 35 U.S.C. 154(b) by 355 days.

(21) Appl. No.: 18/448,323

(22) Filed: Aug. 11, 2023

(65) Prior Publication Data

US 2024/0379590 A1 Nov. 14, 2024

(30) Foreign Application Priority Data

May 10, 2023 (TW) ................................. 112117377

(51) Int. Cl.
| | |
|---|---|
| *H01L 23/66* | (2006.01) |
| *H01L 21/56* | (2006.01) |
| *H01L 23/00* | (2006.01) |
| *H01L 23/31* | (2006.01) |
| *H01L 25/16* | (2023.01) |
| *H10W 44/20* | (2026.01) |
| *H10W 74/01* | (2026.01) |

(Continued)

(52) U.S. Cl.
CPC ......... *H10W 44/20* (2026.01); *H10W 74/016* (2026.01); *H10W 74/121* (2026.01); *H10W 90/00* (2026.01); *H10W 44/209* (2026.01);

*H10W 44/248* (2026.01); *H10W 74/15* (2026.01); *H10W 90/724* (2026.01); *H10W 90/734* (2026.01)

(58) Field of Classification Search
CPC ... H01L 23/66; H01L 23/3135; H01L 21/565; H01L 24/16; H01L 24/32; H01L 24/73; H01L 25/16; H01L 2223/6616; H01L 2223/6677; H01L 2224/16227; H01L 2224/16238; H01L 2224/32225; H01L 2224/73204; H01L 2924/19101
See application file for complete search history.

(56) References Cited

U.S. PATENT DOCUMENTS

| | | | | |
|---|---|---|---|---|
| 2019/0348747 A1* | 11/2019 | Liu | .......................... | H01L 24/20 |
| 2019/0348748 A1* | 11/2019 | Liu | ..................... | H01L 23/3135 |

* cited by examiner

*Primary Examiner* — Peniel M Gumedzoe
(74) *Attorney, Agent, or Firm* — Dority & Manning, PA

(57) ABSTRACT

An electronic package and a manufacturing method thereof are provided, in which an electronic element is disposed on a carrier structure with a circuit layer, a first encapsulating layer and a second encapsulating layer are formed on the carrier structure to cover the electronic element, a first antenna layer is formed on the first encapsulating layer, and a second antenna layer communicatively connected to the first antenna layer is formed on the second encapsulating layer. Therefore, the thickness of the first encapsulating layer is used to control the resonance distance of the antenna frequency so as to generate better resonance effect, and the distance between the first antenna layer and the second antenna layer is controlled by the thickness of the second encapsulating layer to increase the bandwidth of the antenna.

18 Claims, 3 Drawing Sheets

(51) Int. Cl.
    H10W 74/10       (2026.01)
    H10W 90/00       (2026.01)
    *H10W 74/15*        (2026.01)

ELECTRONIC PACKAGE AND MANUFACTURING METHOD THEREOF

BACKGROUND

1. Technical Field

The present disclosure relates to a semiconductor packaging technology, and more particularly, to an electronic package with an antenna structure and a manufacturing method thereof.

2. Description of Related Art

Nowadays, wireless communication technology has been widely used in various consumer electronics (such as mobile phones, tablet computers, etc.) to receive or send various wireless signals. In order to meet the portability of consumer electronics and the convenience of surfing the Internet (such as viewing multimedia content), the manufacture and design of wireless communication modules are developed towards light, thin, short and small requirements, in which the planar antenna is widely used in wireless communication modules of electronic products due to its small size, light weight and easy manufacture.

Further, since the improvement of image quality of the current multimedia content, the file size has become larger, and thus the bandwidth of wireless transmission also needs to be increased, resulting in the fifth generation of wireless transmission (5G). In addition, since the high transmission frequency of 5G, the requirements for its related wireless communication modules are also high.

The application of 5G is the trend of comprehensive commodification in the future, its application frequency range is about 1 GHz to 100 GHz and business application model is 5G with 4G LTE, where cellular base stations are set up outdoors to match the small base stations indoors. Therefore, 5G mobile communications will use a large number of antennas in the base stations to meet the high capacity, fast transmission and low latency of the 5G system.

FIG. 1 is a schematic perspective view of a conventional wireless communication module 1. As shown in FIG. 1, the wireless communication module 1 includes: a substrate 10, a plurality of electronic elements 11 disposed on the substrate 10, an antenna structure 12 and an encapsulant 13. The substrate 10 is a circuit board in a rectangular shape. The electronic elements 11 are disposed on the substrate 10 and electrically connected to the substrate 10. The antenna structure 12 is planar and has an antenna body 120 and a wire 121, and the antenna body 120 is electrically connected to the electronic element 11 via the wire 121. The encapsulant 13 covers the electronic elements 11 and a portion of the wire 121.

However, in the conventional wireless communication module 1, the antenna structure 12 is planar, and the length and width of the substrate 10 are fixed, resulting in limited wiring space (number of layers), and thus limiting the function of the antenna structure 12, causing the wireless communication module 1 to be unable to provide the electrical functions required to operate the 5G system, so that it is difficult to meet the requirements of the antenna operation of the 5G system.

Furthermore, if the layout area is increased on the surface of the substrate 10 to form the antenna elements that assist the antenna structure 12, the width of the substrate 10 will be increased, making it difficult to reduce the width of the wireless communication module 1, such that the wireless communication module 1 cannot meet the requirement of miniaturization.

Therefore, there is a need for a solution that addresses the aforementioned shortcomings in the prior art.

SUMMARY

In view of the aforementioned shortcomings of the prior art, the present disclosure provides an electronic package, which comprises: a carrier structure having a circuit layer; an electronic element disposed on the carrier structure and electrically connected to the circuit layer; a first encapsulating layer formed on the carrier structure and covering the electronic element, wherein a portion of a surface of the electronic element is exposed from the first encapsulating layer; a first antenna layer formed on the first encapsulating layer; a second encapsulating layer formed on the first encapsulating layer and covering the portion of the electronic element exposed from the first encapsulating layer; and a second antenna layer bonded on the second encapsulating layer and communicatively connected to the first antenna layer.

The present disclosure also provides a method of manufacturing an electronic package, the method comprises: providing a carrier structure having a circuit layer; disposing an electronic element on the carrier structure, wherein the electronic element is electrically connected to the circuit layer; forming a first encapsulating layer on the carrier structure to cover the electronic element, wherein a portion of a surface of the electronic element is exposed from the first encapsulating layer; forming a first antenna layer on the first encapsulating layer; forming a second encapsulating layer on the first encapsulating layer to cover the portion of the electronic element exposed from the first encapsulating layer; and forming a second antenna layer on the second encapsulating layer, wherein the second antenna layer is communicatively connected to the first antenna layer.

In the aforementioned electronic package and method, a thickness of the first encapsulating layer is at most 60 microns.

In the aforementioned electronic package and method, a thickness of the first encapsulating layer is less than a height of the electronic element relative to the carrier structure.

In the aforementioned electronic package and method, a thickness of the second encapsulating layer is at least 150 microns.

In the aforementioned electronic package and method, a thickness of the second encapsulating layer is greater than a thickness of the first encapsulating layer.

In the aforementioned electronic package and method, a thickness of the second encapsulating layer is two to three times a thickness of the first encapsulating layer.

In the aforementioned electronic package and method, a material of the first encapsulating layer and a material of the second encapsulating layer are the same or different.

In the aforementioned electronic package and method, the first antenna layer and the second antenna layer are coupled to transmit signals.

In the aforementioned electronic package and method, the present disclosure further comprises disposing a conductive pillar in the first encapsulating layer to electrically connect the first antenna layer and the circuit layer.

As can be understood from the above, in the electronic package and the manufacturing method thereof according to the present disclosure, the first encapsulating layer and the second encapsulating layer are formed by two packaging processes, so that the thickness of the first encapsulating layer is used to control the resonance distance of the antenna frequency, so as to generate better resonance effect, and the thickness of the second encapsulating layer is used to control the distance between the first antenna layer and the second antenna layer to increase the bandwidth of the antenna. Therefore, compared with the prior art, the electronic package of the present disclosure can provide the electrical functions required to operate the B5G/6G system after 5G to meet the requirements of the antenna operation.

Furthermore, the electronic package not only meets the requirement of antenna bandwidth, but also meets the requirement of miniaturization by controlling the thickness of the second encapsulating layer to be two to three times the thickness of the first encapsulating layer.

DETAILED DESCRIPTION

Figure 1:
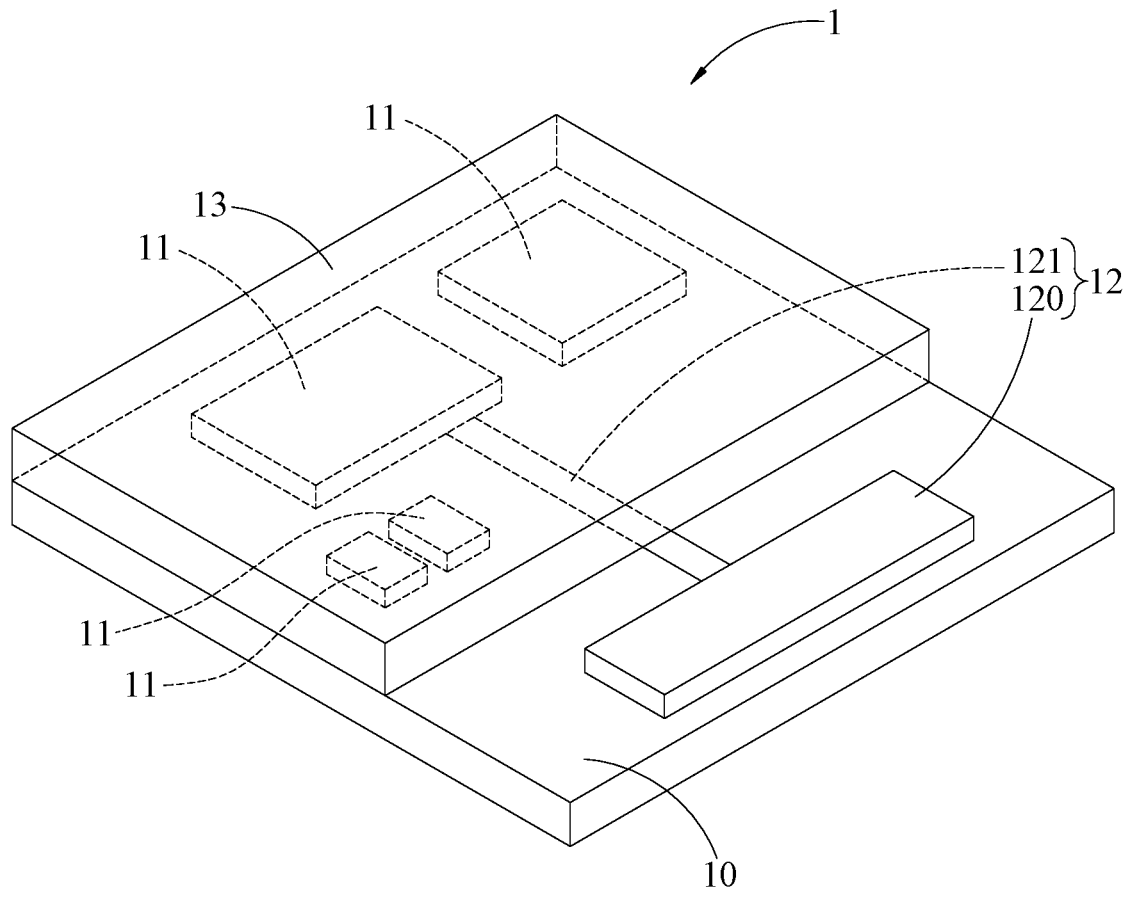
FIG. 1 is a schematic perspective view of a conventional wireless communication module.

Implementations of the present disclosure are described below by embodiments. Other advantages and technical effects of the present disclosure can be readily understood by one of ordinary skill in the art upon reading the disclosure of this specification.

It should be noted that the structures, ratios, sizes shown in the drawings appended to this specification are provided in conjunction with the disclosure of this specification in order to facilitate understanding by those skilled in the art. They are not meant, in any ways, to limit the implementations of the present disclosure, and therefore have no substantial technical meaning. Without influencing the effects created and objectives achieved by the present disclosure, any modifications, changes or adjustments to the structures, ratios, or sizes are construed as falling within the scope covered by the technical contents disclosed herein. Meanwhile, terms such as "on," "above," "first," "second," "a," "one," and the like, are for illustrative purposes, and are not meant to limit the scope implementable by the present disclosure. Any changes or adjustments made to the relative relationships, without substantially modifying the technical contents, are also to be construed as within the scope implementable by the present disclosure.

FIG. 2A to FIG. 2D are schematic cross-sectional views illustrating a method of manufacturing an electronic package 2 according to the present disclosure.

Figure 2A:
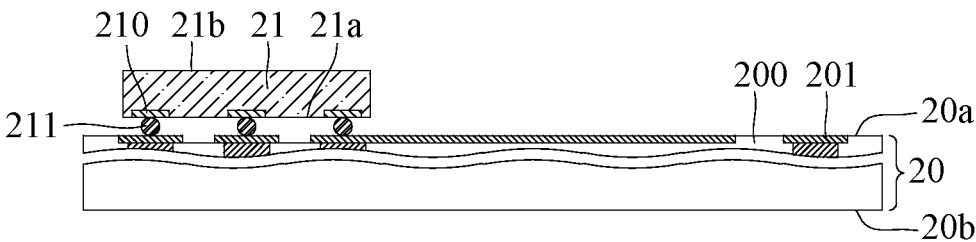
FIG. 2A to FIG. 2D are schematic cross-sectional views illustrating a method of manufacturing an electronic package according to the present disclosure.

As shown in FIG. 2A, a carrier structure 20 is provided and has a first side 20a and a second side 20b opposing the first side 20a. And then, at least one electronic element 21 is disposed on the first side 20a of the carrier structure 20.

The carrier structure 20 is, for example, a package substrate with a core layer and a circuit structure or a coreless circuit structure. The carrier structure 20 comprises an insulating layer 200 and a circuit layer 201 formed on the insulating layer 200, such as at least one fan-out type redistribution layer (RDL).

In an embodiment, a material forming the circuit layer 201 is copper, and a material forming the insulating layer 200 is such as polybenzoxazole (PBO), polyimide (PI), prepreg (PP), or other dielectric materials.

It should be understood that the carrier structure 20 may also be other carrier units such as a silicon interposer or a lead frame that is capable of carrying electronic elements such as chips, but the present disclosure is not limited to as such.

The electronic element 21 is an active element, a passive element, or a combination of the active element and the passive element, wherein the active element may be a semiconductor chip, and the passive element may be a resistor, a capacitor, or an inductor.

In an embodiment, the electronic element 21 is a semiconductor chip, such as a radio-frequency integrated circuit (RFIC). The electronic element 21 has an active surface 21a and an inactive surface 21b opposing the active surface 21a, and a plurality of electrode pads 210 are formed on the active surface 21a. The electronic element 21 is disposed on the circuit layer 201 via a plurality of conductive bumps 211 such as solder materials in a flip-chip manner and is electrically connected to the circuit layer 201; alternatively, the electronic element 21 can be electrically connected to the circuit layer 201 via a plurality of bonding wires (not shown) in a wire-bonding manner; or, the electronic element 21 can directly contact the circuit layer 201. It should be understood that the manner of electrically connecting the electronic element 21 to the carrier structure 20 is not limited to the above.

Figure 2B:
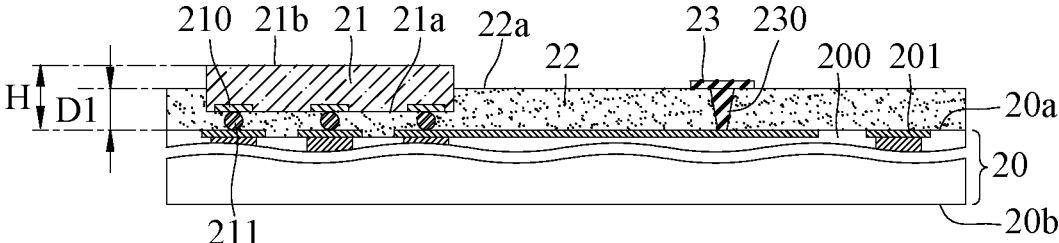

As shown in FIG. 2B, a first encapsulating layer 22 is formed on the first side 20a of the carrier structure 20, so that the first encapsulating layer 22 at least partially covers the electronic element 21 and covers the plurality of conductive bumps 211. Next, a first antenna layer 23 is formed on the first encapsulating layer 22, and a conductive pillar 230 electrically connecting the first antenna layer 23 and the circuit layer 201 is formed in the first encapsulating layer 22.

In an embodiment, the first encapsulating layer 22 is made of an insulating material, such as polyimide (PI), dry film, epoxy resin, or molding compound, and the first encapsulating layer 22 can be formed on the first side 20a of the carrier structure 20 in a manner of lamination or molding.

Furthermore, a thickness D1 of the first encapsulating layer 22 is less than a height H of the electronic element 21 relative to the first side 20a, so that a surface 22a of the first encapsulating layer 22 is lower than the inactive surface 21b, such that the electronic element 21 protrudes from the first encapsulating layer 22. For example, the thickness D1 of the first encapsulating layer 22 is at most 60 microns (μm) to meet the requirements of the high frequency resonance cavity.

Also, the first antenna layer 23 can be fabricated in a manner of sputtering, vapor deposition, electroplating, electroless plating, chemical plating, or foiling, and so on.

In addition, the first antenna layer 23 and the conductive pillar 230 can be fabricated separately or integrally formed. For example, the conductive pillar 230 can be fabricated by using a TMV (through molding via) process first, and then the first antenna layer 23 is fabricated.

Figure 2C:
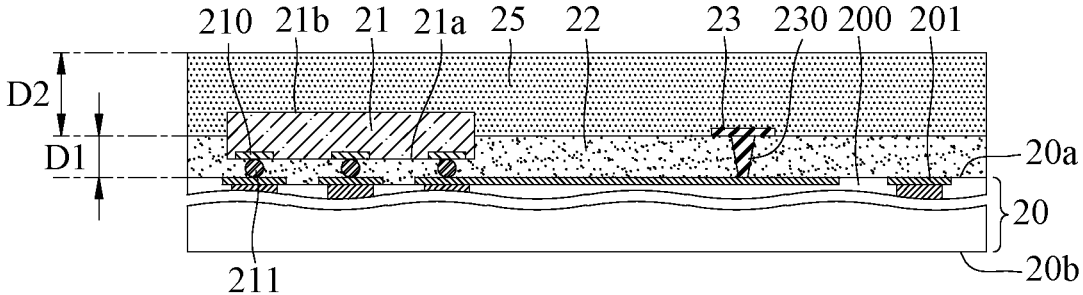

As shown in FIG. 2C, a second encapsulating layer 25 is formed on the first encapsulating layer 22, so that the second encapsulating layer 25 covers the portion of the electronic element 21 exposed from the first encapsulating layer 22.

In an embodiment, the second encapsulating layer 25 is made of an insulating material, such as polyimide (PI), dry film, epoxy resin, or molding compound, and the second encapsulating layer 25 can be formed on the first encapsulating layer 22 in a manner of lamination or molding. It should be understood that the material forming the second encapsulating layer 25 and the material forming the first encapsulating layer 22 may be the same or different.

Furthermore, the inactive surface 21b of the electronic element 21 is covered by the second encapsulating layer 25. Alternatively, the inactive surface 21b of the electronic element 21 can be exposed from the second encapsulating layer 25 according to requirements.

Also, a thickness D2 of the second encapsulating layer 25 is greater than the thickness D1 of the first encapsulating layer 22. For example, the thickness D2 of the second encapsulating layer 25 is two to three times the thickness D1 of the first encapsulating layer 22.

Figure 2D:
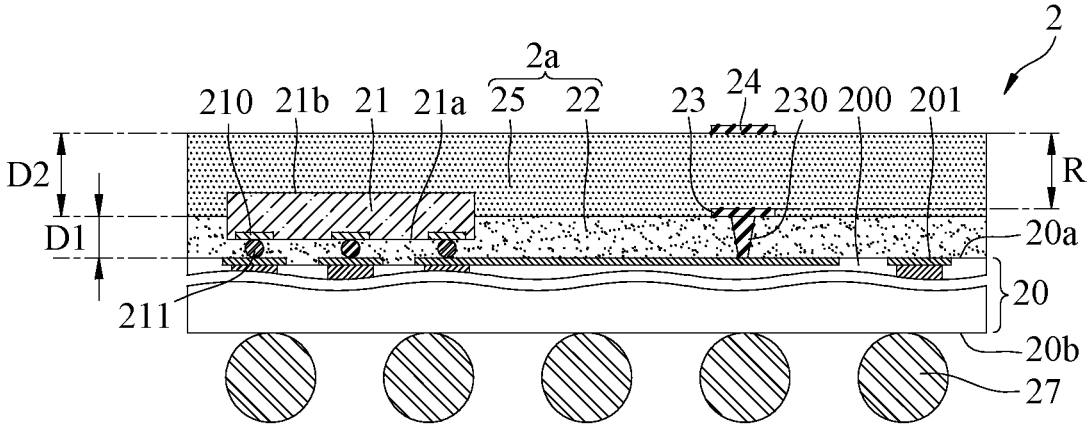

As shown in FIG. 2D, a second antenna layer 24 corresponding to the position of the first antenna layer 23 is formed on the second encapsulating layer 25, so that the first antenna layer 23 and the second antenna layer 24 are located on opposite sides of the second encapsulating layer 25 to form an antenna structure 2a.

In an embodiment, the second antenna layer 24 can be fabricated in a manner of sputtering, vapor deposition, electroplating, electroless plating, chemical plating, or foiling, and so on. For example, the first antenna layer 23 is used as a main antenna in the form of a circuit, and the second antenna layer 24 is used as an antenna patch in the form of a film.

Moreover, the first antenna layer 23 and the second antenna layer 24 transmit signals by coupling, so that the conductive pillar 230 is served as a feed line of the antenna structure 2a. Therefore, by electrically connecting to the conductive pillar 230, the electronic element 21 is served as the source of the antenna signals or receives the antenna signals. For instance, the first antenna layer 23 and the second antenna layer 24 can generate radiation energy by alternating voltage, alternating current, or radiation change, and the radiation energy is an electromagnetic field, so that the first antenna layer 23 and the second antenna layer 24 can be electromagnetically coupled to each other, such that antenna signals can be transmitted between the first antenna layer 23 and the second antenna layer 24. It can be understood that there is no other conductive material between the first antenna layer 23 and the second antenna layer 24.

Also, based on the principle that the thicker the second encapsulating layer 25 is, the greater the bandwidth of the antenna structure 2a is, the thickness D2 of the second encapsulating layer 25 can be at least 150 microns (μm).

In addition, a plurality of conductive elements 27 such as solder balls can be formed on the second side 20b of the carrier structure 20, so that in subsequent manufacturing processes, the electronic package 2 can be connected to an electronic device (not shown) such as a circuit board via the conductive elements 27.

Therefore, in the manufacturing method of the present disclosure, the first encapsulating layer 22 and the second encapsulating layer 25 are formed by two packaging processes, so that the thickness D1 of the first encapsulating layer 22 is used to control the resonance distance of required frequency of the antenna structure 2a to make the antenna structure 2a have a better resonance effect, and the thickness D2 of the second encapsulating layer 25 is used to control a distance R between the first antenna layer 23 (main antenna) and the second antenna layer 24 (antenna patch) to increase the bandwidth of the antenna structure 2a. Hence, compared with the prior art, the electronic package 2 of the present disclosure can provide the electrical functions required for operating the 5G system, so as to achieve the requirements of the antenna operation of the 5G system.

Furthermore, the electronic package 2 not only meets the requirement of antenna bandwidth, but also optimizes the size of the overall structure, that is, meets the requirement of miniaturization by controlling the thickness D2 of the second encapsulating layer 25 to be two to three times the thickness D1 of the first encapsulating layer 22.

The present disclosure further provides an electronic package 2, which comprises: a carrier structure 20 having a circuit layer 201, at least one electronic element 21, a first encapsulating layer 22, a first antenna layer 23 formed on the first encapsulating layer 22, a second encapsulating layer 25 and a second antenna layer 24 bonded on the second encapsulating layer 25.

The electronic element 21 is disposed on the carrier structure 20 and electrically connected to the circuit layer 201.

The first encapsulating layer 22 is disposed on the carrier structure 20 to at least partially cover the electronic element 21, and a portion of a surface of the electronic element 21 is exposed from the first encapsulating layer 22.

The second encapsulating layer 25 is formed on the first encapsulating layer 22 and covers the portion of the electronic element 21 exposed from the first encapsulating layer 22.

The second antenna layer 24 is communicatively connected to the first antenna layer 23.

In one embodiment, a thickness D1 of the first encapsulating layer 22 is at most 60 microns.

In one embodiment, the thickness D1 of the first encapsulating layer 22 is less than a height H of the electronic element 21 relative to the carrier structure 20.

In one embodiment, a thickness D2 of the second encapsulating layer 25 is at least 150 microns.

In one embodiment, the thickness D2 of the second encapsulating layer 25 is greater than the thickness D1 of the first encapsulating layer 22.

In one embodiment, the thickness D2 of the second encapsulating layer 25 is two to three times the thickness D1 of the first encapsulating layer 22.

In one embodiment, a material of the first encapsulating layer 22 and a material of the second encapsulating layer 25 are the same or different.

In one embodiment, the first antenna layer 23 and the second antenna layer 24 are coupled to transmit signals.

In one embodiment, the electronic package 2 further comprises at least one conductive pillar 230 disposed in the first encapsulating layer 22 and electrically connected to the first antenna layer 23 and the circuit layer 201.

In view of the above, in the electronic package and the manufacturing method thereof according to the present disclosure, the thickness of the first encapsulating layer controls the resonance distance of required frequency of the antenna structure by forming the first encapsulating layer and the second encapsulating layer to make the antenna structure have a better resonance effect, and the thickness of the second encapsulating layer controls the distance between the first antenna layer and the second antenna layer to increase the bandwidth of the antenna structure. Therefore, the electronic package of the present disclosure can provide the electrical functions required for operating the 5G system, so as to achieve the requirements of the antenna operation of the 5G system.

Furthermore, the electronic package not only meets the requirement of antenna bandwidth, but also meets the requirement of miniaturization by controlling the thickness of the second encapsulating layer to be two to three times the thickness of the first encapsulating layer.

The above embodiments are provided for illustrating the principles of the present disclosure and its technical effect, and should not be construed as to limit the present disclosure in any way. The above embodiments can be modified by one of ordinary skill in the art without departing from the spirit and scope of the present disclosure. Therefore, the scope claimed of the present disclosure should be defined by the following claims.

What is claimed is:

1. An electronic package, comprising:

a carrier structure having a circuit layer;

an electronic element disposed on the carrier structure and electrically connected to the circuit layer;

a first encapsulating layer formed on the carrier structure and covering the electronic element, wherein a portion of a surface of the electronic element is exposed from the first encapsulating layer;

a first antenna layer formed on the first encapsulating layer;

a second encapsulating layer formed on the first encapsulating layer and directly covering the portion of the electronic element exposed from the first encapsulating layer; and a second antenna layer bonded on the second encapsulating layer and communicatively connected to the first antenna layer.

2. The electronic package of claim 1, wherein a thickness of the first encapsulating layer is at most 60 microns.

3. The electronic package of claim 1, wherein a thickness of the first encapsulating layer is less than a height of the electronic element relative to the carrier structure.

4. The electronic package of claim 1, wherein a thickness of the second encapsulating layer is at least 150 microns.

5. The electronic package of claim 1, wherein a thickness of the second encapsulating layer is greater than a thickness of the first encapsulating layer.

6. The electronic package of claim 1, wherein a thickness of the second encapsulating layer is two to three times a thickness of the first encapsulating layer.

7. The electronic package of claim 1, wherein a material of the first encapsulating layer and a material of the second encapsulating layer are the same or different.

8. The electronic package of claim 1, wherein the first antenna layer and the second antenna layer are coupled to transmit signals.

9. The electronic package of claim 1, further comprising a conductive pillar disposed in the first encapsulating layer and electrically connected to the first antenna layer and the circuit layer.

10. A method for manufacturing an electronic package, the method comprising:

providing a carrier structure having a circuit layer;

disposing an electronic element on the carrier structure, wherein the electronic element is electrically connected to the circuit layer;

forming a first encapsulating layer on the carrier structure to cover the electronic element, wherein a portion of a surface of the electronic element is exposed from the first encapsulating layer;

forming a first antenna layer on the first encapsulating layer;

forming a second encapsulating layer on the first encapsulating layer to directly cover the portion of the electronic element exposed from the first encapsulating layer; and forming a second antenna layer on the second encapsulating layer, wherein the second antenna layer is communicatively connected to the first antenna layer.

11. The method of claim 10, wherein a thickness of the first encapsulating layer is at most 60 microns.

12. The method of claim 10, wherein a thickness of the first encapsulating layer is less than a height of the electronic element relative to the carrier structure.

13. The method of claim 10, wherein a thickness of the second encapsulating layer is at least 150 microns.

14. The method of claim 10, wherein a thickness of the second encapsulating layer is greater than a thickness of the first encapsulating layer.

15. The method of claim 10, wherein a thickness of the second encapsulating layer is two to three times a thickness of the first encapsulating layer.

16. The method of claim 10, wherein a material of the first encapsulating layer and a material of the second encapsulating layer are the same or different.

17. The method of claim 10, wherein the first antenna layer and the second antenna layer are coupled to transmit signals.

18. The method of claim 10, further comprising disposing a conductive pillar in the first encapsulating layer to electrically connect the first antenna layer and the circuit layer.

* * * * *